United States Patent
Bernardon et al.

(10) Patent No.: US 12,130,311 B2
(45) Date of Patent: Oct. 29, 2024

(54) CURRENT SENSE CIRCUITRY

(71) Applicant: Infineon Technologies Austria AG, Villach (AT)

(72) Inventors: Derek Bernardon, Villach (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 138 days.

(21) Appl. No.: 18/081,134

(22) Filed: Dec. 14, 2022

(65) Prior Publication Data

US 2024/0201231 A1 Jun. 20, 2024

(51) Int. Cl.
| | | |
|---|---|---|
| *G01R 19/00* | (2006.01) | |
| *H02M 1/00* | (2007.01) | |
| *H02M 1/32* | (2007.01) | |

(52) U.S. Cl.
CPC ...... *G01R 19/0092* (2013.01); *H02M 1/0009* (2021.05); *H02M 1/32* (2013.01)

(58) Field of Classification Search
CPC .... G01R 19/0092; H02M 1/0009; H02M 1/32
See application file for complete search history.

(56) References Cited

U.S. PATENT DOCUMENTS

| | | | | |
|---|---|---|---|---|
| 5,621,601 A | * | 4/1997 | Fujihira | ............. H03K 17/0828 361/115 |
| 8,054,059 B2 | * | 11/2011 | Wu | ....................... H02M 3/156 323/314 |
| 9,335,779 B2 | | 5/2016 | Sambucco | |
| 9,519,303 B2 | * | 12/2016 | Ballarin | .................. G05F 3/262 |
| 9,664,713 B2 | | 5/2017 | Sambucco et al. | |
| 9,791,881 B2 | | 10/2017 | Bernacchia et al. | |
| 9,798,347 B2 | | 10/2017 | Sambucco et al. | |
| 10,794,982 B2 | * | 10/2020 | Newlin | .................. G01R 19/32 |
| 11,251,622 B1 | * | 2/2022 | Sherwood | ............... H02M 7/04 |
| 2005/0218963 A1 | | 10/2005 | Ball et al. | |
| 2013/0001792 A1 | | 1/2013 | Uno et al. | |
| 2014/0320095 A1 | | 10/2014 | Sambucco | |
| 2016/0124027 A1 | | 5/2016 | Sambucco et al. | |
| 2017/0077923 A1 | | 3/2017 | Sambucco | |
| 2019/0140630 A1 | | 5/2019 | Chen et al. | |

* cited by examiner

*Primary Examiner* — Reena Aurora
(74) *Attorney, Agent, or Firm* — Murphy, Bilak & Homiller, PLLC

(57) ABSTRACT

Current sense circuitry includes: a current mirror circuit for sensing a power transistor current; a capacitor directly connected to the current mirror circuit at a first node; and a comparator circuit having a first input electrically connected to an input terminal of the current mirror circuit, a second input electrically connected to a drain or source terminal of the power transistor, and an output that is in a first state when a voltage at the first input is higher than a voltage at the second input and in a second state when the voltage at the first input is lower than the voltage at the second input. Current is sourced to the first node if the power transistor is on and the comparator output is in the second state, and sunk from the first node if the power transistor is on and the comparator output is in the first state.

20 Claims, 8 Drawing Sheets

CURRENT SENSE CIRCUITRY

BACKGROUND

GaN (gallium nitride) technology enables higher switching frequencies, e.g., above 200 to 250 kHz. Many power electronics applications approach such high frequencies with low operational duty cycles, making it significantly more difficult to have accurate current sensing that is fast enough to track the current through a GaN power device that is in the ON phase for very short times. Another problem is the aging of the main GaN power device with respect to the sense device which results in decreasing current sense accuracy over time. A further problem is sensing voltages that can go up to 600V or higher with a low voltage technology such as Si (silicon). Providing low voltage protection on a GaN die involves several trade-offs and therefore is challenging to achieve.

Thus, there is a need for improved current sensing technology of GaN dies.

SUMMARY

According to an embodiment of a GaN (gallium nitride) die, the GaN die comprises: a first current sense terminal; a second current sense terminal; a main GaN power transistor; a GaN current sense transistor having a source electrically connected to a source of the main GaN power transistor; a diode device electrically connected in series between a drain of the main GaN power transistor and a drain of the GaN current sense transistor; a first voltage protection device electrically connecting the drain of the main GaN power transistor to the first sense terminal; and a second voltage protection device electrically connecting the drain of the GaN current sense transistor to the second sense terminal.

According to an embodiment of a power electronics device, the power electronics device comprises: a GaN (gallium nitride) die comprising a first current sense terminal, a second current sense terminal, a main GaN power transistor, a GaN current sense transistor having a source electrically connected to a source of the main GaN power transistor, a diode device electrically connected in series between a drain of the main GaN power transistor and a drain of the GaN current sense transistor, a first voltage protection device electrically connecting the drain of the main GaN power transistor to the first sense terminal, and a second voltage protection device electrically connecting the drain of the GaN current sense transistor to the second sense terminal; and a current sense circuit electrically connected to the first and second current sense terminals, wherein the first voltage protection device is configured to protect the current sense circuit from the full drain voltage of the main GaN power transistor and the second voltage protection device is configured to protect the current sense circuit from the full drain voltage of the GaN current sense transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a die (chip) such as a GaN die having current sense readout circuitry with low voltage protection, for enabling current sensing, e.g., with a low voltage technology such as Si (silicon). Also described herein are embodiments of current sense circuitry that can be used with the dies described herein or with other power semiconductor dies that provide current sense readouts.

Described next, with reference to the figures, are exemplary embodiments of the die and current sense circuitry.

Figure 1:
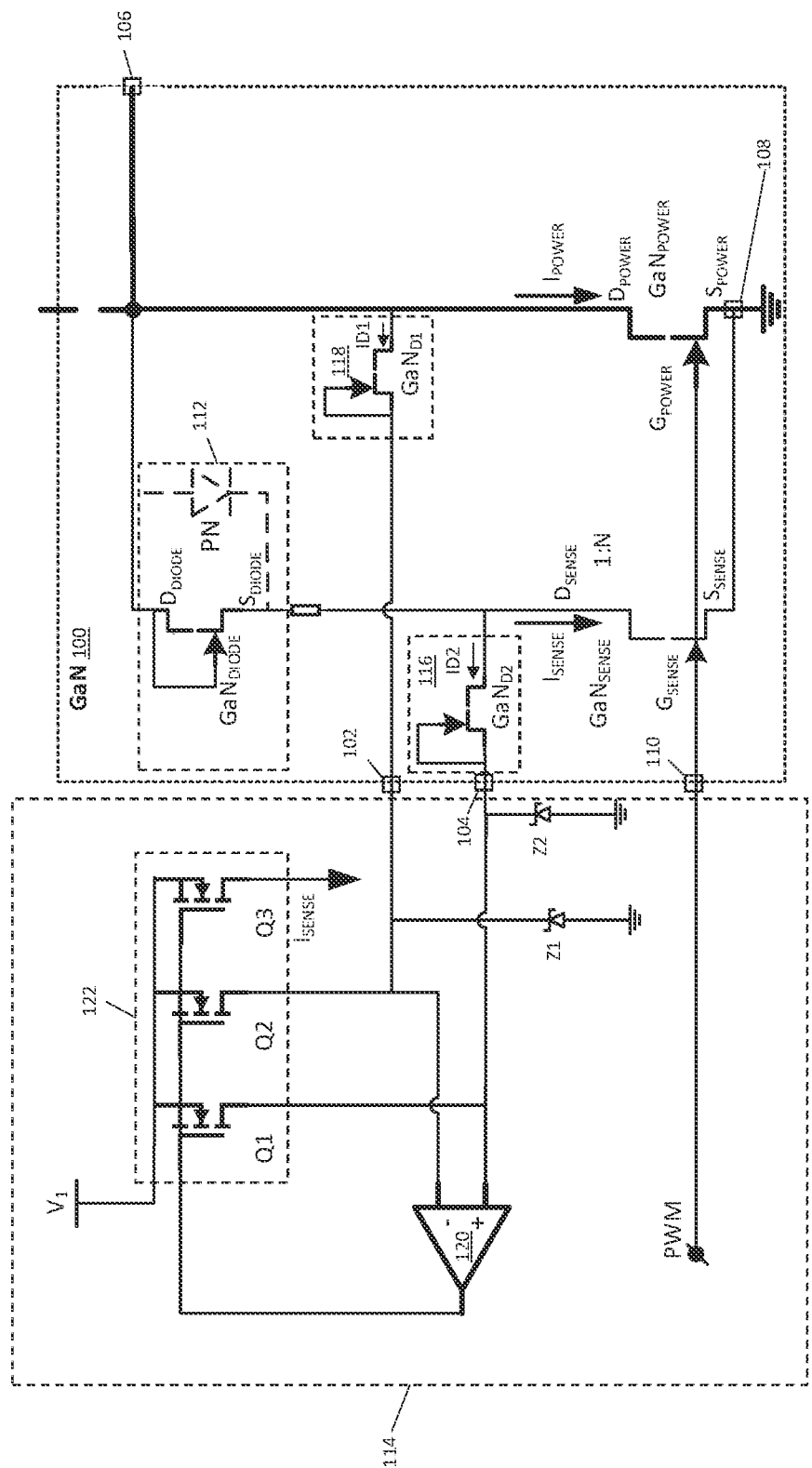
FIG. 1 illustrates a schematic diagram of an embodiment of a GaN die with high voltage protection for external current sense circuitry electrically connected to the current sense terminals of the GaN die.

FIG. 1 illustrates an embodiment of a die 100. The die 100 is described herein as a GaN die that includes GaN devices, but the die 100 may utilize another semiconductor technology such as Si, SiC, etc. Accordingly, the function of the devices included in the die 100 are technology independent but described herein in the context of GaN technology. As such, the transistors, diode devices, etc. described herein and that are included in the die 100 may be GaN devices, Si devices, SiC devices, etc.

With this understanding, the GaN die 100 includes a first current sense terminal 102, a second current sense terminal 104, a main GaN power transistor $GaN_{POWER}$, and a GaN current sense transistor $GaN_{SENSE}$. The GaN die 100 includes additional terminals such as a drain terminal 106, a source terminal 108 and a control terminal 110. The terminals 102, 104, 106, 108, 110 may be bond or contact pads at the frontside and/or backside of the GaN die 100, for example. The on/off state of the GaN current sense transistor $GaN_{SENSE}$ and the main GaN power transistor $GaN_{POWER}$ is controlled by a signal such as a PWM (pulse width modulation) signal that drives the gate terminal 110 of the GaN die 100.

The main GaN power transistor $GaN_{POWER}$ included in the GaN die 100 may be part of a low-side switch device of any type of power electronics device that operates at a relatively high frequency, e.g., above 200 to 250 KHz and which requires accurate current sensing. For example, the main GaN power transistor $GaN_{POWER}$ may be part of a low-side switch for a power, boost converter, Flyback converter, PFC (power factor correction) stage, etc.

The source $S_{SENSE}$ of the GaN current sense transistor $GaN_{SENSE}$ is electrically connected to the source $S_{POWER}$ of the main GaN power transistor $GaN_{POWER}$. The GaN current sense transistor $GaN_{SENSE}$ provides a scaled-down replica $I_{SENSE}$ of the current $I_{POWER}$ flowing in the main GaN power transistor $GaN_{POWER}$. In one embodiment, the channel width of the GaN current sense transistor $GaN_{SENSE}$ is in a range of 1:2000 to 1:4000 of the channel width of the main GaN power transistor $GaN_{POWER}$.

The main GaN power transistor $GaN_{POWER}$ and the GaN current sense transistor $GaN_{SENSE}$ may be normally-off (i.e., enhancement mode) devices, for example. For a normally-off device, a current conduction channel is not present between the drain and source $D_{POWER}$, $S_{POWER}/D_{SENSE}$, $S_{SENSE}$ of the corresponding GaN transistor $GaN_{POWER}/GaN_{SENSE}$ without a suitable voltage applied to the gate $G_{POWER}/G_{SENSE}$ of the GaN transistor $GaN_{POWER}/GaN_{SENSE}$. In one embodiment, the main GaN power transistor $GaN_{POWER}$ and the GaN current sense transistor $GaN_{SENSE}$ are gate injection transistors (GITs) which are hybrid-drain HEMTs (high electron mobility transistors) with a p-GaN gate that results in a normally-off power switch.

The GaN die 100 also includes a diode device 112 electrically connected in series between the drain $D_{POWER}$ of the main GaN power transistor $GaN_{POWER}$ and the drain $D_{SENSE}$ of the GaN current sense transistor $GaN_{SENSE}$. In one embodiment, the diode device 112 is a GaN transistor $GaN_{DIODE}$ having a drain $D_{DIODE}$ electrically connected to the drain $D_{POWER}$ of the main GaN power transistor $GaN_{POWER}$, a source $S_{DIODE}$ electrically connected to the drain $D_{SENSE}$ of the GaN current sense transistor $GaN_{SENSE}$, and a gate electrically connected to the drain of the GaN transistor. In another embodiment, the diode device 112 is a pn diode PN having an anode electrically connected to the drain $D_{POWER}$ of the main GaN power transistor $GaN_{POWER}$ and a cathode electrically connected to the drain $D_{SENSE}$ of the GaN current sense transistor $GaN_{SENSE}$. The pn diode PN is illustrated with dashed lines in FIG. 1 to indicate that the either the GaN transistor $GaN_{DIODE}$ configured as a HEMT-gated diode or the pn diode PN may be electrically connected in series between the drain $D_{POWER}$ of the main GaN power transistor $GaN_{POWER}$ and the drain $D_{SENSE}$ of the GaN current sense transistor $GaN_{SENSE}$.

In either case, the diode device 112 is subjected to the same drain voltage as the main GaN power transistor $GaN_{POWER}$ which should cause the GaN current sense transistor $GaN_{SENSE}$ to age at the same rate as the main GaN power transistor $GaN_{POWER}$. However, this now causes a high voltage, e.g., go up to 600V or higher on the drain $D_{SENSE}$ of the GaN current sense transistor $GaN_{SENSE}$ which needs to be protected in case external current sense circuitry 114 electrically connected to the first and second current sense terminals 102, 104 of the GaN die 100 is implemented using a low voltage technology such as Si (silicon).

The GaN die 100 provides low voltage protection for the external current sense circuitry 114 via a first voltage protection device 116 and a second voltage protection device 118. The first voltage protection device 116 electrically connects the drain $D_{POWER}$ of the main GaN power transistor $GaN_{POWER}$ to the first sense terminal 102 and protects the current sense circuitry 114 from the full drain voltage, e.g., go up to 600V or higher of the main GaN power transistor $GaN_{POWER}$. The second voltage protection device 118 electrically connects the drain $D_{SENSE}$ of the GaN current sense transistor $GaN_{SENSE}$ to the second sense terminal 104 and protects the current sense circuitry 114 from the full drain voltage of the GaN current sense transistor $GaN_{SENSE}$. In one embodiment, each of the main GaN power transistor $GaN_{POWER}$, the GaN current sense transistor $GaN_{SENSE}$, the first voltage protection device 116, and the second voltage protection device 118 is a Schottky-gate HEMT device where a p-GaN layer can be either partially depleted by a metal/p-GaN Schottky junction or fully depleted, depending on the doping concentration and thickness of the p-GaN layer.

In FIG. 1, the current sense circuitry 114 includes a comparator 120, a current source circuit 122, a first Zener diode Z1 that clamps the voltage at the first current sense terminal 102 of the GaN die 100, and a second Zener diode Z2 that clamps the voltage at the second current sense terminal 104 of the GaN die 100. The comparator 120 has a negative input electrically connected to the first current sense terminal 102 and a positive input electrically connected to the second current sense terminal 104. The current source circuit 122 is controlled by the output of the comparator 120 and forces a current ID1 through the first voltage protection device 116 of the GaN die 100 and that minimizes the voltage difference across the first and second sense terminals 102, 104 of the GaN die 100.

In FIG. 1, the current source circuit 122 includes a first pMOS transistor Q1, a second pMOS transistor Q2, and a third pMOS transistor Q3 each controlled by the output of the comparator 120 and having a source electrically connected to the voltage source $V_1$. The drain of the first pMOS transistor Q1 is electrically connected to the second current sense terminal 104. The drain of the second pMOS transistor Q2 is electrically connected to the first current sense terminal 102. The drain of the third pMOS transistor Q3 forms a current sense output $I_{SENSE}$ of the current sense circuitry 114.

In FIG. 1, the first voltage protection device 116 of the GaN die 100 is a first diode device implemented as a first GaN transistor $GaN_{D1}$ that has a drain electrically connected to the drain $D_{POWER}$ of the main GaN power transistor $GaN_{POWER}$, a source electrically connected to the first sense terminal 102, and a gate electrically connected to the source of the first GaN transistor $GaN_{D1}$. Likewise, the second voltage protection device 118 of the GaN die 100 is a second diode device that may be implemented as a second GaN transistor $GaN_{D2}$ that has a drain electrically connected to the drain $D_{SENSE}$ of the GaN current sense transistor $GaN_{SENSE}$, a source electrically connected to the second sense terminal 104, and a gate electrically connected to the source of the second GaN transistor $GaN_{D2}$. The current source circuit 122 of the external current sense circuitry 114 sets the first current ID1 that flows through the first diode device $GaN_{D1}$ and the second current ID2 that flows through the second diode device $GaN_{D2}$, based on the comparator output. If the first current ID1 is set equal to the second current ID2, then the voltage drop is the same. Current consumption may be reduced by lowering the first current ID1 and the size of first diode device $GaN_{D1}$ such that the voltage drop remains the same. Another option is to use a fixed current source for ID1, which implies less accurate sensing.

Figure 2:
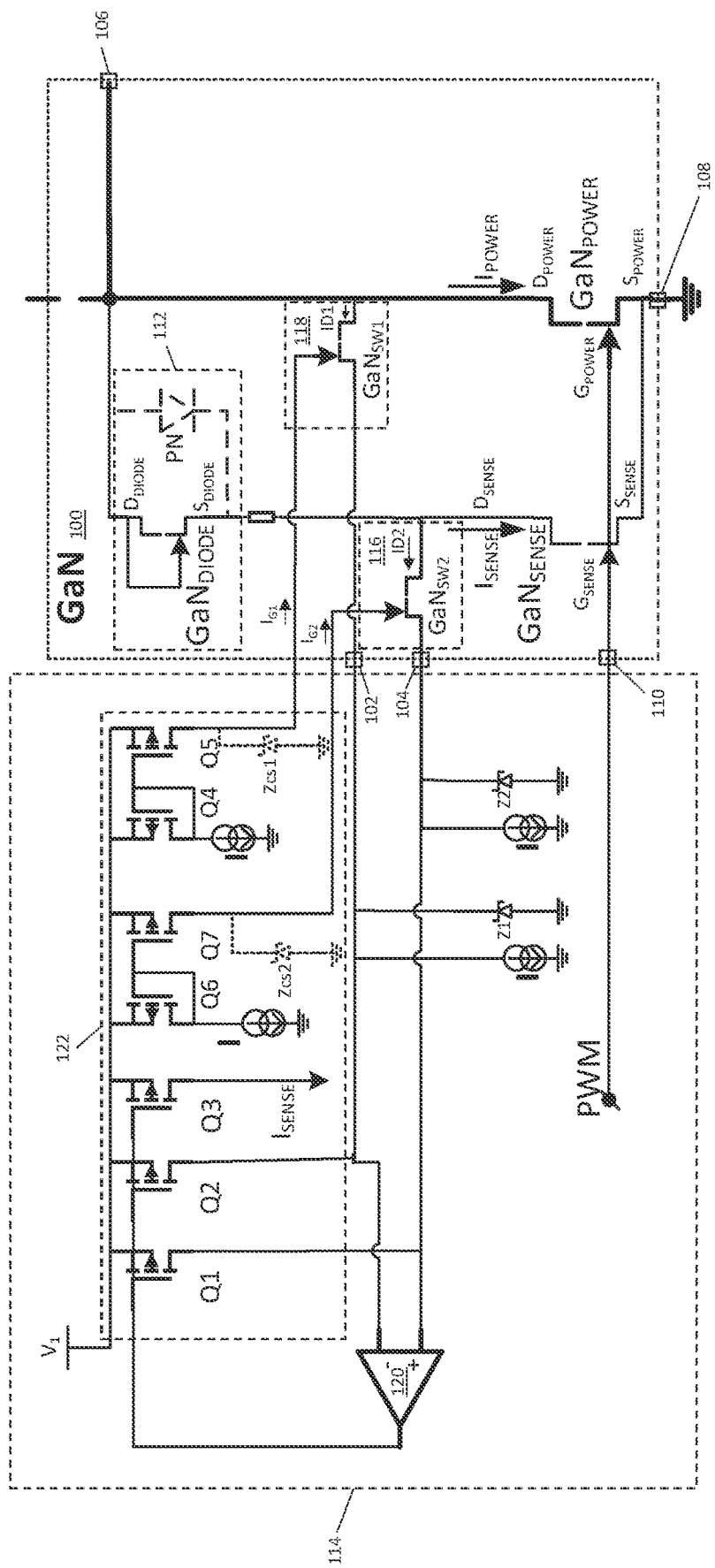
FIG. 2 illustrates a schematic diagram of another embodiment of the GaN die and the external current sense circuitry.

FIG. 2 illustrates another embodiment of the GaN die 100 and the external current sense circuitry 114. According to this embodiment, the first voltage protection device 116 of the GaN die 100 is implemented as a first GaN transistor $GaN_{SW1}$ that is used exclusively as a switch device and configured to be on when the main GaN power transistor $GaN_{POWER}$ is on and to be off when the main GaN power transistor $GaN_{POWER}$ is off. The second voltage protection device 118 is implemented as a second GaN transistor $GaN_{SW2}$ used exclusively as a switch device and configured to be on when the GaN current sense transistor $GaN_{SENSE}$ is on and to be off when the GaN current sense transistor $GaN_{SENSE}$ is off.

The drain of the first GaN switch device $GaN_{SW1}$ is electrically connected to the drain $D_{POWER}$ of the main GaN power transistor GaN$_{POWER}$ and the source of the first GaN switch device GaN$_{SW1}$ is electrically connected to the first current sense terminal 102 of the GaN die 100. The drain of the second GaN switch device GaN$_{SW2}$ is electrically connected to the drain D$_{SENSE}$ of the GaN current sense transistor GaN$_{SENSE}$ and the source of the second GaN switch device GaN$_{SW2}$ is electrically connected to the second current sense terminal 104 of the Gan die 100. The gate and source of the first GaN switch device GaN$_{SW1}$ float with the drain of the main GaN power transistor GaN$_{POWER}$ up to the clamping voltage of the first Zener diode Z1. The gate and source of the second GaN switch device GaN$_{SW2}$ float with the drain of the GaN current sense transistor GaN$_{SENSE}$ up to the clamping voltage of the second Zener diode Z2. The current source circuit 122 of the external current sense circuitry 114 sets a first current ID1 that flows through the first GaN switch device GaN$_{SW1}$ and a second current ID2 that flows through the second GaN switch device GaN$_{SW2}$, based on the comparator output.

In FIG. 2, the current source circuit 122 of the external current sense circuitry 114 includes a first pMOS transistor Q1 controlled by the output of the comparator 120 having a source electrically connected to the voltage source V$_1$ and a drain electrically connected to the first current sense terminal 102, a second pMOS transistor Q2 controlled by the output of the comparator 120 and having a source electrically connected to the voltage source V$_1$ and a drain electrically connected to the second current sense terminal 104, and an additional pMOS transistor Q3 controlled by the output of the comparator 120 and having a source electrically connected to the voltage source V$_1$ and a drain that forms the current sense output I$_{SENSE}$ of the current sense circuitry 114.

In FIG. 2, the current source circuit 122 also includes a first current source formed by a first pair of pMOS transistors Q4, Q5 and a constant current source 'I'. The first current source injects a first gate current I$_{G1}$ into the gate of the first GaN switch device GaN$_{SW1}$ that forms the first voltage protection device 116 of the GaN die 100. The first current source may also include a Zener diode Zcs1 that clamps the voltage at the gate of the first GaN switch device GaN$_{SW1}$.

The current source circuit 122 further includes a second current source formed by a second pair of pMOS transistors Q6, Q7 and a constant current source 'I'. The second current source injects a second gate current I$_{G2}$ into the gate of the second GaN switch device GaN$_{SW2}$ that forms the second voltage protection device 118 of the GaN die 100 in FIG. 2. The second current source may also include a Zener diode Zcs2 that clamps the voltage at the gate of the second GaN switch device GaN$_{SW2}$.

In FIG. 2, the first gate current I$_{G1}$ is subtracted at the negative input of the current sense comparator 120 and the second gate current I$_{G2}$ is subtracted at the positive input of the comparator 120. The GaN switch devices GaN$_{SW1}$, GaN$_{SW2}$ that form the voltage protection devices 116, 118 of the GaN die 100 automatically turn ON and OFF depending on the drain voltage of the sense and main GaN devices GaN$_{POWER}$, GaN$_{SENSE}$, respectively. When the GaN switch devices GaN$_{SW1}$, GaN$_{SW2}$ are ON, the GaN switch devices GaN$_{SW1}$, GaN$_{SW2}$ provide the exact voltage that is to be sensed. The respective external current sources drive the GaN switch devices GaN$_{SW1}$, GaN$_{SW2}$ such that the gate and source of the GaN switch devices GaN$_{SW1}$, GaN$_{SW2}$ can follow a large range of drain voltage for the GaN current sense transistor GaN$_{SENSE}$, which may occur when going from 0 current up to, e.g., 20 A of overcurrent protection. This permits the gate and source of the GaN switch devices GaN$_{SW1}$, GaN$_{SW2}$ to float with the drain of the GaN current sense transistor GaN$_{SENSE}$ only up to the clamping voltage of the respective Zener diodes Z1, Z2. The clamped voltage protects the low voltage external current sense circuitry 114 from overvoltage breakdown.

The current that is injected into the gates of the GaN switch devices GaN$_{SW1}$, GaN$_{SW2}$ that form the voltage protection devices 116, 118 of the GaN die 100 is also drawn out from the source so as to not impact the current sense accuracy. The embodiment shown in FIG. 2 consumes less current and is more accurate than the embodiment shown in FIG. 1. Also, to achieve higher accuracy, the RdsON*Isense drop across the second GaN switch device GaN$_{SW2}$ may be compensated by injecting the Isense current into the first GaN switch device GaN$_{SW1}$, where RdsON is the device on-state resistance.

However, the GaN switch devices GaN$_{SW1}$, GaN$_{SW2}$ in FIG. 2 consume power during the OFF state of the main GaN power transistor GaN$_{POWER}$. This can be mitigated by turning OFF the current sources that bias the GaN switch devices GaN$_{SW1}$, GaN$_{SW2}$ in the OFF state, but this may require a slightly longer time to begin tracking again once the main GaN power transistor GaN$_{POWER}$ is turned back ON.

The external current sense circuitry 114 that senses the current of the GaN die 100 with the high voltage protection may do so using the comparator 120 shown in FIGS. 1 and 2. Described next are additional embodiments of the external current sense circuitry 114 that may be used with GaN dies 100 shown in FIGS. 1 and 2 or with other types of power devices having a current readout. The following current sense are embodiments are described in the context of drain-side sensing of a low-side power switch device but may also be applied to source-side sensing.

Figure 3:
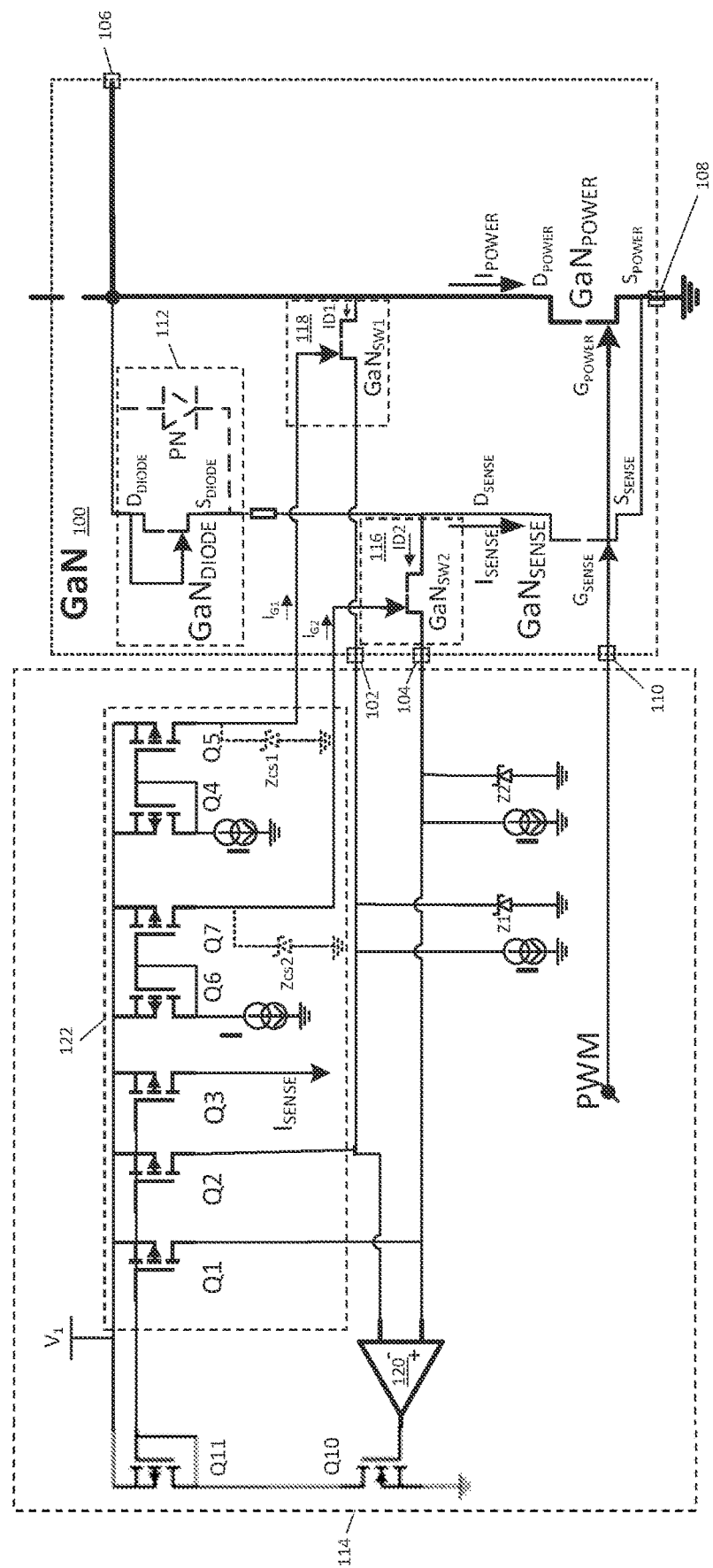
FIG. 3 illustrates a schematic diagram of another embodiment of the external current sense circuitry.

FIG. 3 illustrates an embodiment of the current sense circuitry 114. According to this embodiment, the output of the comparator 120 drives the gate of an nMOS transistor Q10 the drain of which is electrically connected to an additional pMOS transistor Q11 so as generate a current source which can be mirrored out and equalize the voltage across the inputs of the comparator 120.

Figure 4:
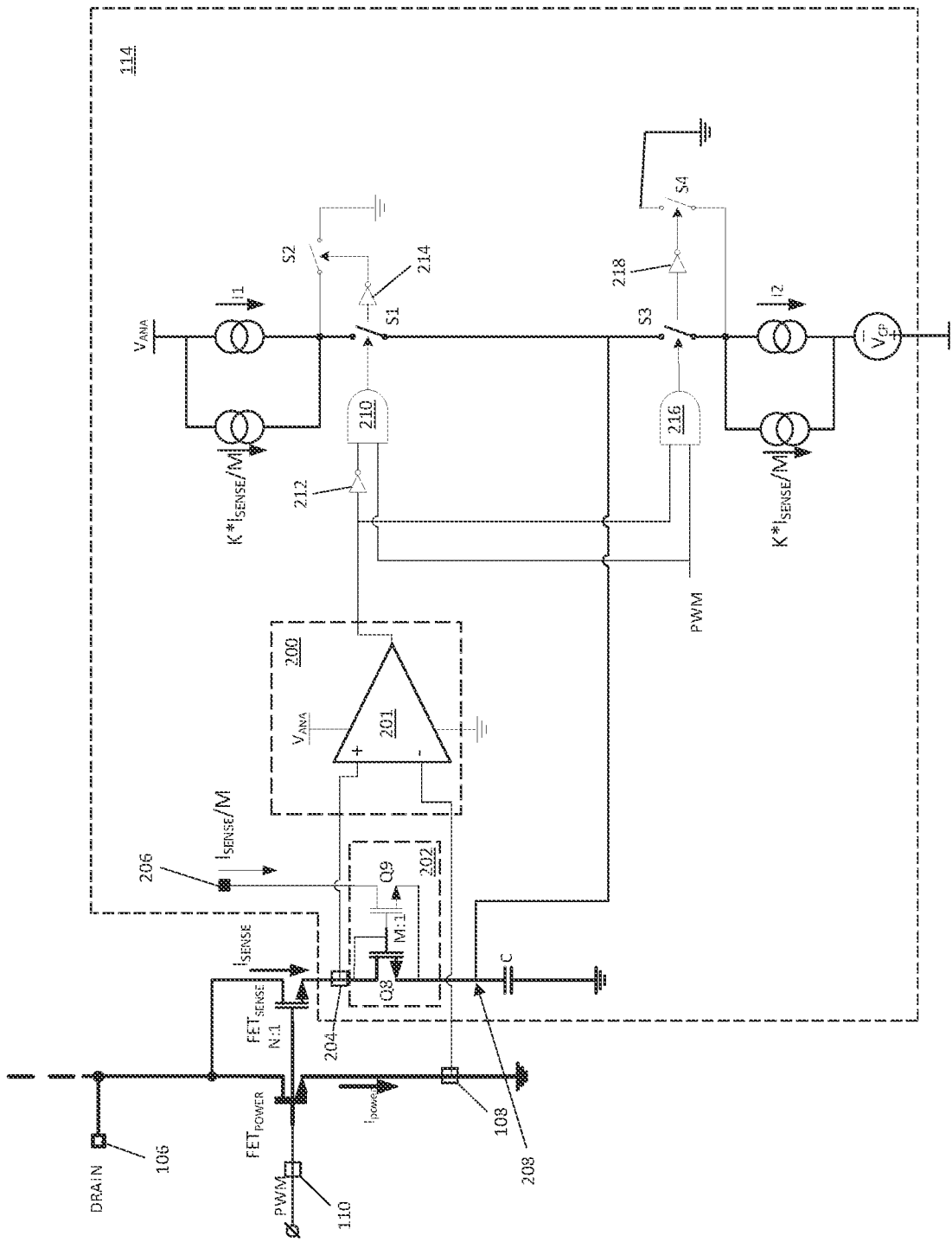
FIG. 4 illustrates a schematic diagram of another embodiment of the external current sense circuitry.

FIG. 4 illustrates an embodiment of the current sense circuitry 114. According to this embodiment, the tracking behavior of the sense current is sped up during the ON phase of the main power transistor FET$_{POWER}$. The main power transistor FET$_{POWER}$ may be the GaN power transistor GaN$_{POWER}$ shown in FIG. 1 or 2, or a different type of power transistor such as a power MOSFET (metal-oxide-semiconductor field-effect transistor). The current I$_{SENSE}$ being sensed is a 1:N replica of the main power transistor current I$_{POWER}$ and is provided by a sense transistor FET$_{SENSE}$ on the same die as the main power transistor FET$_{POWER}$, where 1:N may be in a range of 1:2000 to 1:4000, for example. No overshoot or undershoot is expected in FIG. 4, because the control method implemented in FIG. 4 includes hysteretic control which uses the hysteresis of a comparator circuit 200.

In FIG. 4, the current sense circuitry 114 includes a reference diode/current mirror circuit 202 that inputs the sensed current I$_{SENSE}$ from the sense transistor FET$_{SENSE}$ at an input terminal 204 and provides a scaled-down (1:M) version I$_{SENSE/M}$ of the sensed current I$_{SENSE}$ at an output terminal 206. In one embodiment, the power transistor FET$_{POWER}$ is part of a low-side switch device, e.g., as shown in FIG. 1 or FIG. 2, such that the current I$_{SENSE}$ input to the input terminal 204 of the reference diode/current mirror circuit 202 is a scaled-down (1:N) replica of the current flowing in a low-side power switch device. The output current $I_{SENSE/M}$ of the current sense circuitry 114 is a fraction (1:M) of the current $I_{SENSE}$ at the input terminal 204 of the reference diode/current mirror circuit 202. A capacitor C is directly connected to the reference diode/current mirror circuit 202 at a first node 208, and averages the current that is being sourced and sunk by first and second switched current sources I1, I2.

In FIG. 4, the current mirror circuit 202 includes a first transistor Q8 having a source terminal that corresponds to the input terminal 204 of the current mirror circuit 202, a gate terminal, and a drain terminal electrically connected to the gate terminal. The current mirror circuit 202 in FIG. 4 also includes a second transistor Q9 having a source terminal electrically connected to the source terminal of the first transistor Q8, a gate terminal electrically connected to the gate terminal of the first transistor Q8, and a drain terminal that corresponds to the output terminal 206 of the current mirror circuit 202.

The comparator circuit 200 of the current sense circuitry 114 in FIG. 4 has a first input electrically connected to the input terminal 204 of the reference diode/current mirror circuit 202, a second input electrically connected to the drain or source terminal of the power transistor power transistor $FET_{POWER}$, and an output that is in a first state when a voltage at the first input is higher than the voltage at the second input and in a second state when the voltage at the first input is lower than the voltage at the second input. In FIG. 4, the second input of the comparator circuit 200 is electrically connected to the source terminal of the power transistor $FET_{POWER}$ and the comparator circuit 200 is implemented as a single comparator 201 having a positive (+) input as the first input and a negative (−) input as the second input.

The first switched current source I1 of the current sense circuitry 114 in FIG. 4 sources current to the first (capacitor) node 208 if the power transistor $FET_{POWER}$ is on and the comparator output is in the second state. The second switched current source I2 sinks current from the first (capacitor) node 208 if the power transistor $FET_{POWER}$ is on and the comparator output is in the first state. The capacitor C averages the current that is being sourced and sunk by the switched current sources I1, I2. This current is sensed by the reference diode/current mirror circuit 202 which makes the sensed current available as $I_{SENSE/M}$.

In FIG. 4, the negative input of the comparator circuit 200 is electrically connected to the source terminal of the power transistor $FET_{POWER}$, the first switched current source I1 includes a positive voltage source or charge pump $V_{ANA}$, and the second switched current source I2 includes a negative voltage source or charge pump $V_{CP}$. In another embodiment, the negative input of the comparator circuit 200 is electrically connected to the drain terminal of the power transistor $FET_{POWER}$ and both the first switched current source I1 and the second switched current source I2 each include a positive voltage source or charge pump $V_{ANA}/V_{CP}$.

To reduce current consumption and further speed up the tracking behavior of the current sense circuitry 114, a scaled version $K*I_{SENSE/M}$ of the sensed current $I_{SENSE/M}$ at the output terminal of the reference diode/current mirror circuit 202 is fed forward to the first switched current source I1 such that the current sourced to the first (capacitor) node 208 by the first switched current source I1 changes proportionally with the current $I_{SENSE}$ at the input terminal 204.

The scaled version $K*I_{SENSE/M}$ of the sensed current $I_{SENSE/M}$ also is fed forward to the second switched current source I2 such that the current sunk from the first (capacitor) node 208 by the second switched current source I2 changes proportionally with the sensed current $I_{SENSE}$ at the input terminal 204. The current consumption increases as the main transistor current $I_{POWER}$ increases, and the current sense circuitry 114 in FIG. 4 can track $I_{POWER}$ over a wide range of output currents, e.g., 0 A up to 20 A or higher. Also, the positive fed forward $K*I_{SENSE/M}$ current permits the current tracking to occur much quicker as the fed forward $K*I_{SENSE/M}$ causes the respective switched current sources I1, I2 to increase until reaching the corresponding target comparator value.

In FIG. 4, the first switched current source I1 is controlled by the output of the comparator circuit 200 and a gate signal PWM applied to the power transistor $FET_{POWER}$, e.g., via a first logic AND gate 210 and a first inverter 212, such that the first switched current source I1 sources current to the first (capacitor) node 208 if the gate signal PWM is active and the comparator output is in the second state. A first switch device S1 connects the first switched current source I1 to the first (capacitor) node 208 when the output of the first logic AND gate 210 is in a logic high state. A second switch device S2 and inverter 214 connect the first switched current source I1 to ground when the output of the first logic AND gate 210 is in a logic low state.

The second switched current source I2 is controlled by the output of the comparator circuit 200 and the gate signal PWM, e.g., via a second logic AND gate 216, such that the second switched current source I2 sinks current from the first (capacitor) node 208 if the gate signal PWM is active and the comparator output is in the first state. A third switch device S3 connects the second switched current source I2 to the first (capacitor) node 208 when the output of the second logic AND gate 216 is in a logic high state. A fourth switch device S4 and inverter 218 connect the second switched current source I2 to ground when the output of the second logic AND gate 216 is in a logic low state.

Figure 5:
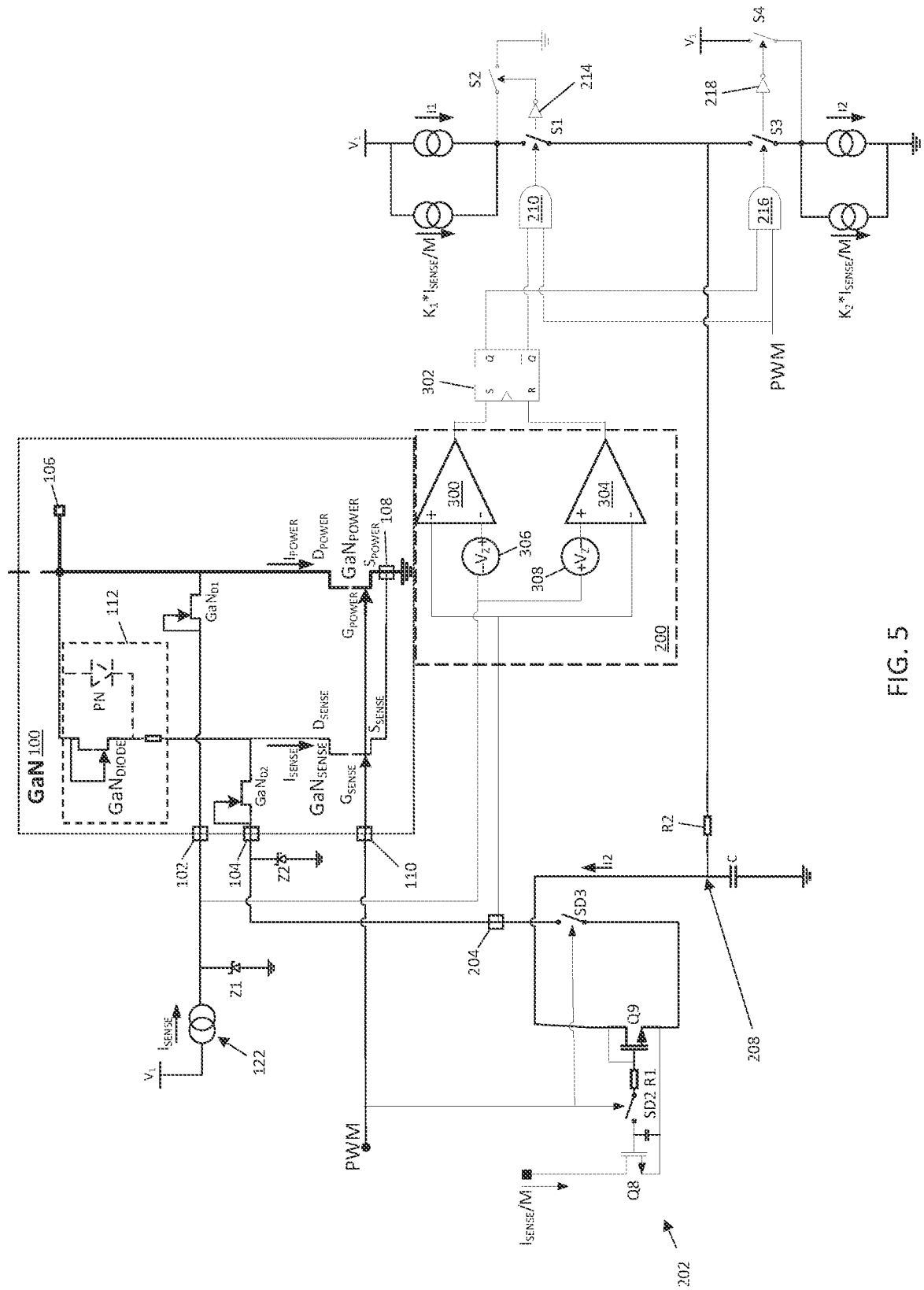
FIG. 5 illustrates a schematic diagram of another embodiment of the external current sense circuitry.

FIG. 5 illustrates another embodiment of the current sense circuitry 114 which is shown sensing the current $I_{SENSE}$ from the GaN die 100 shown in FIG. 1. However, the current sense circuitry 114 in FIG. 5 may be used to sense the current of a different type of power transistor die such as a power MOSFET die.

In FIG. 5, the comparator circuit 200 is implemented as a dual comparator. The first comparator 300 has a positive input (+) electrically connected to the input terminal 204 of the current mirror circuit 202, a negative input (−) electrically connected to the drain terminal $D_{POWER}$ of the main GaN power transistor $GaN_{POWER}$, and an output that drives a set input (S) of a latch 302. The second comparator 304 has a positive input (+) electrically connected to the drain terminal $D_{POWER}$ of the main GaN power transistor $GaN_{POWER}$, a negative input (−) electrically connected to the input terminal 204 of the current mirror circuit 202, and an output that drives a reset input (R) of the latch 302. The first comparator 300 is for a defined upper edge and the second comparator 304 is for a defined lower edge, each comparator 300, 304 having an offset. The comparator offsets control the hysteresis which controls the width of voltage oscillation, yielding higher accuracy and improved peak current control. Use zeroing comparators 300, 304 where one comparator 300/304 runs and the other comparator 304/300 is zeroing reduces the offset error over the operational lifetime. A resistor R2 may be provided for attenuation.

In FIG. 5, the negative input (−) of the first comparator 300 and the positive input (+) of the second comparator 304 are electrically connected to the drain terminal $D_{POWER}$ of the main GaN power transistor GaN$_{POWER}$. However, the negative input (−) of the first comparator 300 and the positive input (+) of the second comparator 304 instead may be electrically connected to the source terminal S$_{POWER}$ of the main GaN power transistor GaN$_{POWER}$.

In FIG. 5, the comparator circuit 200 also includes a first hysteresis voltage source 306 electrically connected between the negative input (−) of the first comparator 300 and the drain (or source) terminal D$_{POWER}$ of the main GaN power transistor GaN$_{POWER}$ and a second hysteresis voltage source 308 electrically connected between the positive input (+) of the second comparator 304 and the drain (or source) terminal D$_{POWER}$ of the main GaN power transistor GaN$_{POWER}$.

In FIG. 5, the gate terminal of the second transistor Q9 of the reference diode/current mirror circuit 202 is electrically connected to the gate terminal of the first transistor Q8 of the reference diode/current mirror circuit 202 by a switch device SD2 in series with a resistor R1. The switch device SD2 is controlled by the gate signal PWM applied to the main GaN power transistor GaN$_{POWER}$ such that the switch device SD2 is closed when the gate signal PWM is active. An additional switch device SD3 controls the connection to the input terminal 204 of the current mirror circuit 202 and may be controlled by the gate signal PWM applied to the main GaN power transistor GaN$_{POWER}$, thus enabling a discrete current sense implementation.

In FIG. 5, diode devices GaN$_{D1}$, GaN$_{D2}$ are used for high voltage protection and current sensing at the GaN die 100, and accurately track the drain voltage of the main GaN power transistor GaN$_{POWER}$. The diode devices GaN$_{D1}$, GaN$_{D2}$ are faster than an op-amp but not as fast as sensing the source voltage of the main GaN power transistor GaN$_{POWER}$ since it takes time for the drain and sense voltages to settle with the drain-side sensing.

Figure 6:
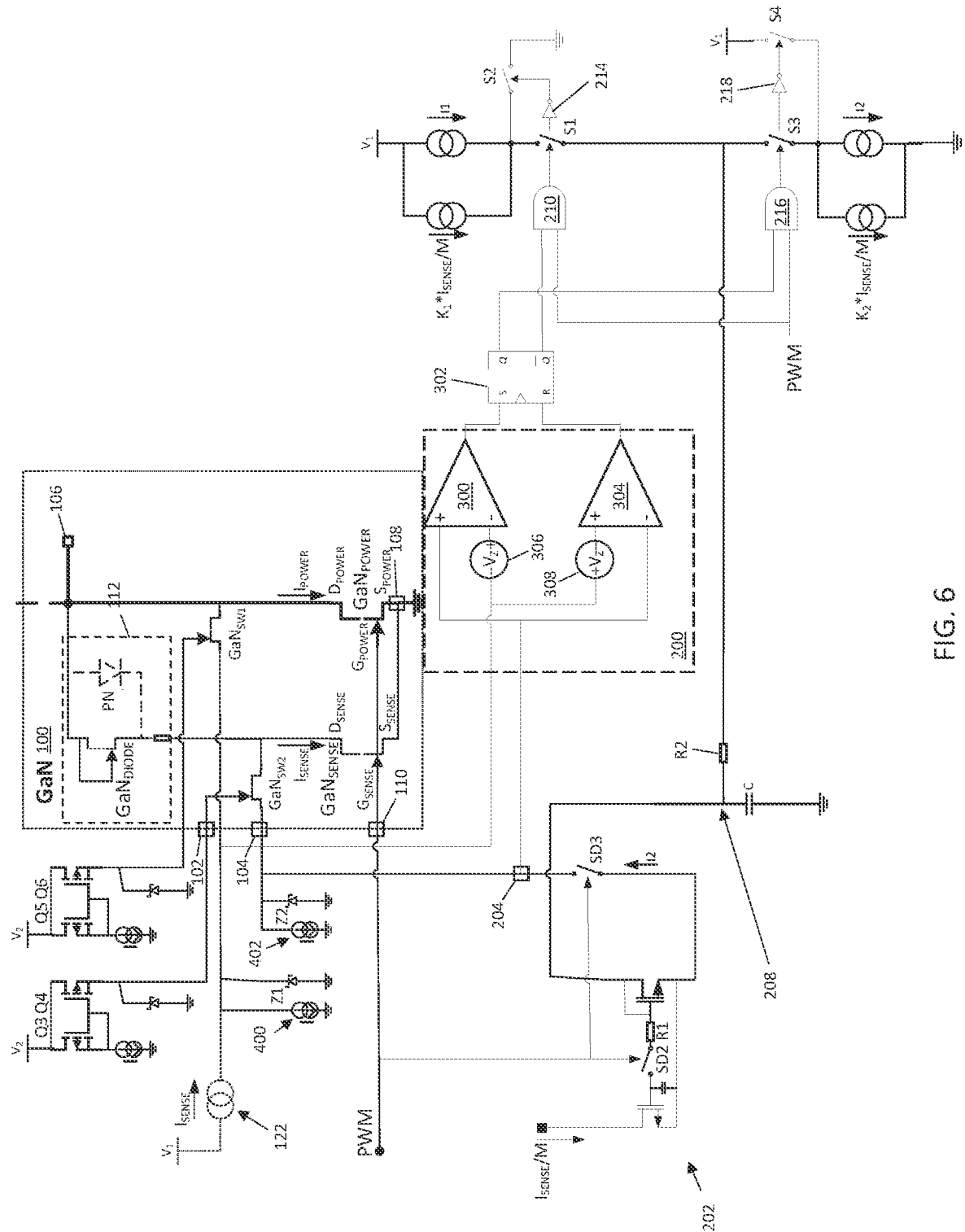
FIG. 6 illustrates a schematic diagram of another embodiment of the external current sense circuitry.

FIG. 6 illustrates another embodiment of the current sense circuitry 114 which is shown sensing the current I$_{SENSE}$ from the GaN die 100 shown in FIG. 2. However, the current sense circuitry 114 in FIG. 6 may be used to sense the current of a different type of power transistor die such as a power MOSFET die.

As explained above, the voltage protection devices 116, 118 included in the GaN die 100 are implemented as respective GaN transistors GaN$_{SW1}$, GaN$_{SW2}$ in FIG. 2. The first GaN transistors GaN$_{SW1}$ is used exclusively as a switch device that is ON when the main GaN power transistor GaN$_{POWER}$ is on and OFF when the main GaN power transistor GaN$_{POWER}$ is off. The second GaN transistor GaN$_{SW2}$ is used exclusively as a switch device that is ON when the GaN current sense transistor GaN$_{SENSE}$ is on and OFF when the GaN current sense transistor GaN$_{SENSE}$ is off. This non-linear control scheme accurately tracks the current I$_{SENSE}$ and is very fast compared to an op-amp but as fast as sensing the source voltage due to the drain and sense voltage having to settle. The GaN switch devices GaN$_{SW1}$, GaN$_{SW2}$ are clamped as the drain voltage of the main GaN power transistor GaN$_{POWER}$ rises. The voltage of the GaN switch devices GaN$_{SW1}$, GaN$_{SW2}$ is then brought back down to a lower voltage by a respective current source 400, 402 so that when either GaN switch device GaN$_{SW1}$, GaN$_{SW2}$ turns back ON, the settling time is much shorter and the tracking is faster. The current sources 400, 402 may be shut off after a pulse to eliminate power dissipation at the GaN switch devices GaN$_{SW1}$, GaN$_{SW2}$ during this phase.

Figure 7:
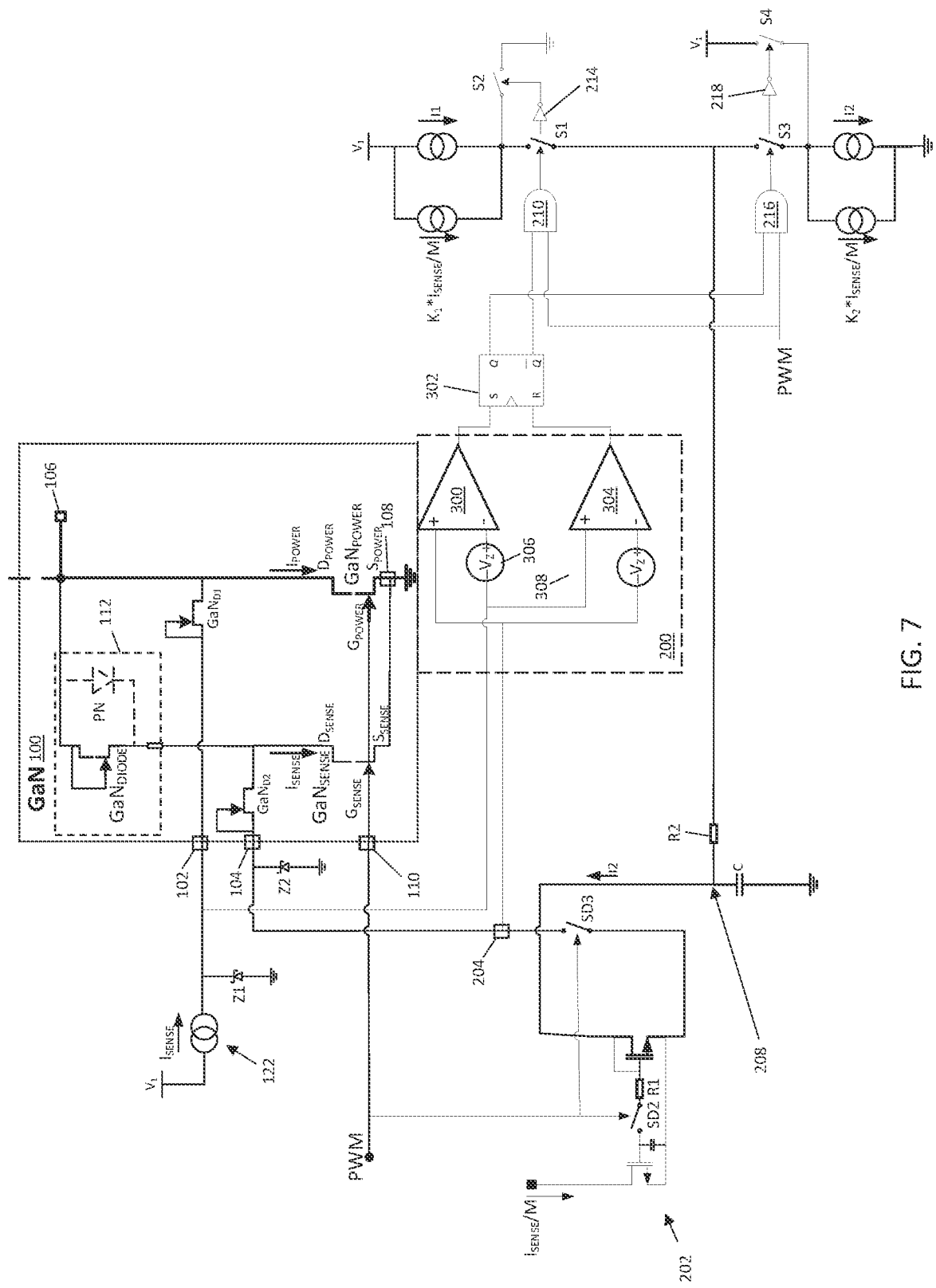
FIG. 7 illustrates a schematic diagram of another embodiment of the external current sense circuitry.

FIG. 7 illustrates another embodiment of the current sense circuitry 114 which is shown sensing the current I$_{SENSE}$ from the GaN die 100 shown in FIG. 2. The embodiment illustrated in FIG. 6 is similar to the embodiment illustrated in FIG. 6, with the difference being the implementation of the hysteresis voltage sources 306, 308. In FIG. 7, which implements low-side current sensing, the hysteresis voltage sources 306, 308 provide a positive reference 'VZ' for both comparators 300, 304 compared to FIG. 6 in which the first hysteresis voltage source 306 provides a positive reference 'VZ' for the first comparator 300 and the second hysteresis voltage source 308 provides a negative reference 'VZ' for the second comparator 304.

Figure 8:
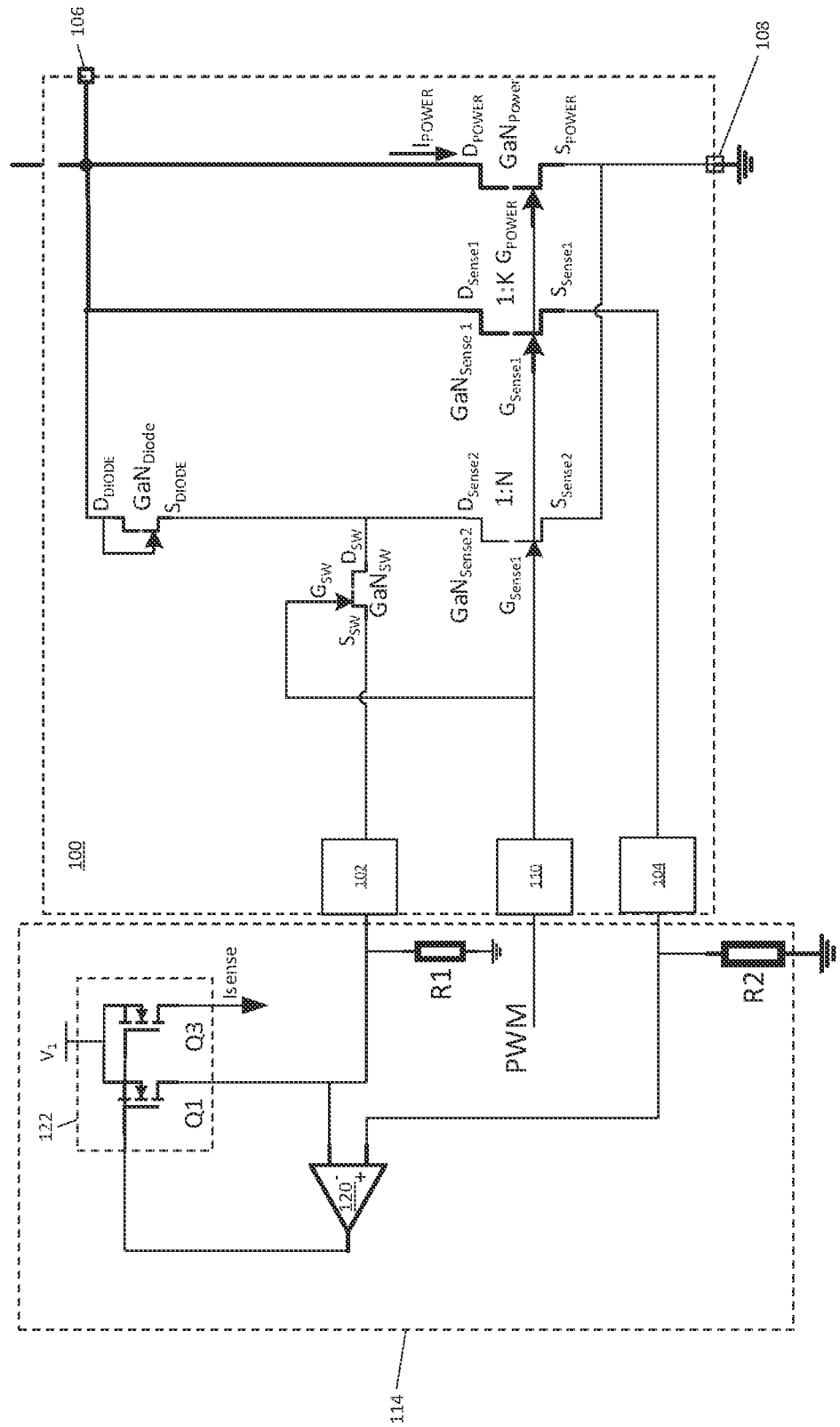
FIG. 8 illustrates a schematic diagram of another embodiment of the GaN die and the external current sense circuitry.

FIG. 8 illustrates another embodiment of the GaN die 100 and the external current sense circuitry 114. According to this embodiment, a first GaN current sense transistor GaN$_{Sense1}$ is electrically connected between the drain D$_{POWER}$ of the main GaN power transistor GaN$_{POWER}$ and the second current sense terminal 104 and has a size ratio of 1:K compared to the main GaN power transistor GaN$_{POWER}$. A second GaN current sense transistor GaN$_{Sense2}$ is electrically connected between the source S$_{DIODE}$ of the HEMT-gated diode GaN$_{DIODE}$ and the source S$_{POWER}$ of the main GaN power transistor GaN$_{POWER}$ and has a size ratio of 1:N compared to the main GaN power transistor GaN$_{POWER}$. A high voltage protection GaN transistor GaN$_{SW}$ is electrically connected between the first current sense terminal 102 and the node between the source S$_{DIODE}$ of the HEMT-gated diode GaN$_{DIODE}$ and the drain D$_{Sense2}$ of the second GaN current sense transistor GaN$_{Sense2}$. The gates GaN$_{Sense1}$, GaN$_{Sense2}$ of the GaN current sense transistors GaN$_{Sense1}$, GaN$_{Sense2}$ and the gate G$_{SW}$ of the high voltage protection GaN transistor GaN$_{SW}$ are each electrically connected to the gate terminal 110 of the GaN die 100 and therefore controlled by the same signal 'PWM' as the main GaN power transistor GaN$_{POWER}$.

The drain charge trapping phenomena of GaN-based high electron mobility transistors (HEMTs) is added to the second GaN current sense transistor GaN$_{Sense2}$ and the high voltage protection GaN transistor GaN$_{SW}$ by causing both devices GaN$_{Sense2}$ and GaN$_{SW}$ to see about the same drain voltage as the main GaN power transistor GaN$_{POWER}$ during the OFF phase. In GaN technology, there is a minimum width beyond which matching becomes very poor. In FIG. 8, the Kilis factor is increased by including the high voltage protection GaN transistor GaN$_{SW}$ and also using the high voltage protection GaN transistor GaN$_{SW}$ as a sense device (which also has the same OFF phase drain stress), by matching to GaN$_{Sense1}$, GaN$_{Sense2}$ and GaN$_{POWER}$. Such a configuration gives the added benefit that the sum of the two resistances RGaN_SW and RGaN_Sense2 of GaN$_{SW}$ and GaNSense2 reduces the required sense current, and at the same time doubles the area that matches with the main GaN power transistor GaN$_{POWER}$ and the other sense device GaN$_{Sense1}$. Therefore, the new N ratio becomes:

$$N \cong \frac{R_{GaN_{SW}} + R_{GaN_{Sense2}}}{R_{GaN_{Sense1}}} \quad (1)$$

where RGaN_Sense1 is the resistance of the first GaN current sense transistor GaN$_{Sense1}$.

Consequently, the resistor ratio is designed according to the N factor expressed in equation (1). Another benefit is that the temperature coefficient of the sense current may be varied with respect to the main GaN power transistor GaN$_{POWER}$. In this case, the temperature coefficients of the GaN current sense transistors GaN$_{Sense1}$, GaN$_{Sense2}$ differ from the temperature coefficient of the main GaN power transistor $GaN_{POWER}$ by changing the values of R1 and R2.

Also, the high voltage protection GaN transistor $GaN_{SW}$ and the second GaN current sense transistor $GaN_{Sense2}$ being in parallel to resistor R1 desensitizes the sense current from the aging effects of the high voltage protection GaN transistor $GaN_{SW}$ and the second GaN current sense transistor $GaN_{Sense2}$ because their variation does not cause such a significant impact on the final sense current as compared to the embodiments illustrated in FIGS. 3 and 4.

Furthermore, the current through the first GaN current sense transistor $GaN_{Sense1}$ is used for the load and is not current being drawn out of an auxiliary supply such as V1. This allows for dimensioning of the first GaN current sense transistor $GaN_{Sense1}$ to have large enough area for good matching and therefore a better GaN device trap charge distribution uniformity. The embodiment illustrated in FIG. 8 also enables bidirectional current sensing.

The current required for sensing may be minimized by dividing the power current by the factor K and N, where R1=R2*N. The ratio N may be further increased by using both resistance RGaN_SW and RGaN_Sense2 as sense fingers. The high voltage protection GaN transistor $GaN_{SW}$ is used both as a switch during the OFF phase to protect low voltage devices of the external current sense circuitry 114 and as a sense finger during the ON phase. Simulations have shown that smaller fingers have a different temperature coefficient as the main GaN power transistor $GaN_{POWER}$, however proper dimensioning of the resistors R1 and R2 allows for adjustment of the temperature coefficient.

The examples of the current sense circuitry 114 shown in FIGS. 1, 2, 3 and 8 may be used interchangeably. That is, the example of the current sense circuitry 114 shown in FIG. 1 may be replaced by the example of the current sense circuitry 114 shown in FIG. 2, 3, or 8, the example of the current sense circuitry 114 shown in FIG. 2 may be replaced by the example of the current sense circuitry 114 shown in FIG. 1, 3 or 8, the example of the current sense circuitry 114 shown in FIG. 3 may be replaced by the example of the current sense circuitry 114 shown in FIG. 1, 2 or 8, or the example of the current sense circuitry 114 shown in FIG. 8 may be replaced by the example of the current sense circuitry 114 shown in FIG. 1, 2, or 3.

Although the present disclosure is not so limited, the following numbered examples demonstrate one or more aspects of the disclosure.

Example 1. A GaN (gallium nitride) die, comprising: a first current sense terminal; a second current sense terminal; a main GaN power transistor; a GaN current sense transistor having a source electrically connected to a source of the main GaN power transistor; a diode device electrically connected in series between a drain of the main GaN power transistor and a drain of the GaN current sense transistor; a first voltage protection device electrically connecting the drain of the main GaN power transistor to the first sense terminal; and a second voltage protection device electrically connecting the drain of the GaN current sense transistor to the second sense terminal.

Example 2. The GaN die of example 1, wherein a channel width of the GaN current sense transistor is in a range of 1:2000 to 1:4000 of a channel width of the main GaN power transistor.

Example 3. The GaN die of example 1 or 2, wherein the diode device is a GaN transistor having a drain electrically connected to the drain of the main GaN power transistor, a source electrically connected to the drain of the GaN current sense transistor, and a gate electrically connected to the drain of the GaN transistor.

Example 4. The GaN die of any of examples 1 through 3, wherein the diode device is a pn diode having an anode electrically connected to the drain of the main GaN power transistor and a cathode electrically connected to the drain of the GaN current sense transistor.

Example 5. The GaN die of any of examples 1 through 4, wherein the first voltage protection device is a first GaN transistor having a drain electrically connected to the drain of the main GaN power transistor, a source electrically connected to the first sense terminal, and a gate electrically connected to the source of the first GaN transistor, and wherein the second voltage protection device is a second GaN transistor having a drain electrically connected to the drain of the GaN current sense transistor, a source electrically connected to the second sense terminal, and a gate electrically connected to the source of the second GaN transistor.

Example 6. The GaN die of any of examples 1 through 4, wherein the first voltage protection device is a first GaN transistor used exclusively as a switch device and configured to be on when the main GaN power transistor is on and to be off when the main GaN power transistor is off, and wherein the second voltage protection device is a second GaN transistor used exclusively as a switch device and configured to be on when the GaN current sense transistor is on and to be off when the GaN current sense transistor is off.

Example 7. The GaN die of any of examples 1 through 6, wherein each of the main GaN power transistor, the GaN current sense transistor, the first voltage protection device, and the second voltage protection device is a Schottky-gate HEMT (high electron mobility transistor) device.

Example 8. A power electronics device, comprising: a GaN (gallium nitride) die comprising a first current sense terminal, a second current sense terminal, a main GaN power transistor, a GaN current sense transistor having a source electrically connected to a source of the main GaN power transistor, a diode device electrically connected in series between a drain of the main GaN power transistor and a drain of the GaN current sense transistor, a first voltage protection device electrically connecting the drain of the main GaN power transistor to the first sense terminal, and a second voltage protection device electrically connecting the drain of the GaN current sense transistor to the second sense terminal; and a current sense circuit electrically connected to the first and second current sense terminals, wherein the first voltage protection device is configured to protect the current sense circuit from the full drain voltage of the main GaN power transistor and the second voltage protection device is configured to protect the current sense circuit from the full drain voltage of the GaN current sense transistor.

Example 9. The power electronics device of example 8, wherein the current sense circuit comprises: a comparator having a first input electrically connected to the first current sense terminal and a second input electrically connected to the second current sense terminal; and a current source circuit controlled by an output of the comparator and configured to force a current through the first voltage protection device and that minimizes a voltage difference across the first and second sense terminals.

Example 10. The power electronics device of example 9, wherein the first voltage protection device is a first diode device electrically connected to the first input of the comparator via the first current sense terminal, wherein the second voltage protection device is a second diode device electrically connected to the second input of the comparator via the second current sense terminal, and wherein the current source circuit is configured to set a first current that flows through the first diode device and a second current that flows through the second diode device, based on the comparator output.

Example 11. The power electronics device of example 10, wherein the current sense circuit comprises: a first Zener diode configured to clamp the voltage at the first current sense terminal; and a second Zener diode configured to clamp the voltage at the second current sense terminal.

Example 12. The power electronics device of example 10, wherein the current source circuit comprises: a first pMOS transistor controlled by the output of the comparator and having a source electrically connected to a voltage source and a drain electrically connected to the second current sense terminal; a second pMOS transistor controlled by the output of the comparator and having a source electrically connected to the voltage source and a drain electrically connected to the first current sense terminal; and a third pMOS transistor controlled by the output of the comparator and having a source electrically connected to the voltage source and a drain that forms a current sense output of the current sense circuit.

Example 13. The power electronics device of any of examples 9 through 12, wherein the first voltage protection device is a first GaN switch device having a drain electrically connected to the drain of the main GaN power transistor and a source electrically connected to the first current sense terminal, wherein the second voltage protection device is a second GaN switch device having a drain electrically connected to the drain of the GaN current sense transistor and a source electrically connected to the second current sense terminal, and wherein the current source circuit is configured to set a first current that flows through the first GaN switch device and a second current that flows through the second GaN switch device, based on the comparator output.

Example 14. The power electronics device of example 13, wherein the current source circuit comprises: a first pMOS transistor controlled by the output of the comparator and having a source electrically connected to a voltage source and a drain electrically connected to the second current sense terminal; a second pMOS transistor controlled by the output of the comparator and having a source electrically connected to the voltage source and a drain electrically connected to the first current sense terminal; and a third pMOS transistor controlled by the output of the comparator and having a source electrically connected to the voltage source and a drain that forms a current sense output of the current sense circuit.

Example 15. The power electronics device of example 13, wherein the current source circuit comprises: a first current source configured to inject a first gate current into a gate of the first GaN switch device; and a second current source configured to inject a second gate current into a gate of the second GaN switch device, wherein the first gate current is subtracted at the first input of the comparator, wherein the second gate current is subtracted at the second input of the comparator.

Example 16. The power electronics device of example 13, wherein the current sense circuit comprises: a first Zener diode electrically connected to the first current sense terminal; and a second Zener diode electrically connected to the second current sense terminal, wherein the gate and the source of the first GaN switch device float with the drain of the main GaN power transistor up to a clamping voltage of the first Zener diode, wherein the gate and the source of the second GaN switch device float with the drain of the GaN current sense transistor up to a clamping voltage of the second Zener diode.

Example 17. The power electronics device of any of examples 8 through 16, wherein each of the main GaN power transistor, the GaN current sense transistor, the first voltage protection device, and the second voltage protection device is a Schottky-gate HEMT (high electron mobility transistor) device, and wherein the current sense circuit is implemented in silicon.

Example 18. Current sense circuitry, comprising: a current mirror circuit configured to input a sensed current of a power transistor at an input terminal and provide a scaled-down version of the sensed current at an output terminal; a capacitor directly connected to the current mirror circuit at a first node; a comparator circuit having a first input electrically connected to the input terminal of the current mirror circuit, a second input electrically connected to a drain or source terminal of the power transistor, and an output that is in a first state when a voltage at the first input is higher than a voltage at the second input and in a second state when the voltage at the first input is lower than the voltage at the second input; a first switched current source configured to source current to the first node if the power transistor is on and the comparator output is in the second state; and a second switched current source configured to sink current from the first node if the power transistor is on and the comparator output is in the first state.

Example 19. The current sense circuitry of example 18, wherein the second input of the comparator circuit is electrically connected to the source terminal of the power transistor, wherein the first switched current source comprises a positive voltage source or charge pump, and wherein the second switched current source comprises a negative voltage source or charge pump.

Example 20. The current sense circuitry of example 18, wherein the second input of the comparator circuit is electrically connected to the drain terminal of the power transistor, and wherein both the first switched current source and the second switched current source each comprise a positive voltage source or charge pump.

Example 21. The current sense circuitry of any of examples 18 through 20, wherein a scaled version of the current at the output terminal of the current mirror circuit is fed forward to the first switched current source such that the current sourced to the first node by the first switched current source changes proportionally with the sensed current.

Example 22. The current sense circuitry of any of examples 18 through 20, wherein a scaled version of the current at the output terminal of the current mirror circuit is fed forward to the second switched current source such that the current sunk from the first node by the second switched current source changes proportionally with the sensed current.

Example 23. The current sense circuitry of any of examples 18 through 22, wherein the current input to the input terminal of the current mirror circuit is from a low-side power transistor included in the power transistor.

Example 24. The current sense circuitry of any of examples 18 through 23, wherein the first switched current source is controlled by the output of the comparator circuit and a gate signal applied to the power transistor such that the first switched current source sources current to the first node if the gate signal is active and the comparator output is in the second state, and wherein the second switched current source is controlled by the output of the comparator circuit and the gate signal such that the second switched current source sinks current from the first node if the gate signal is active and the comparator output is in the first state.

Example 25. The current sense circuitry of any of examples 18 through 24, wherein the comparator circuit comprises a single comparator having a positive input as the first input and a negative input as the second input.

Example 26. The current sense circuitry of any of examples 18 through 24, wherein the comparator circuit comprises: a first comparator having a positive input electrically connected to the input terminal of the current mirror circuit, a negative input electrically connected to the drain or source terminal of the power transistor, and an output that drives a set input of a latch; and a second comparator having a positive input electrically connected to the drain or source terminal of the power transistor, a negative input electrically connected to the input terminal of the current mirror circuit, and an output that drives a reset input of the latch.

Example 27. The current sense circuitry of example 26, wherein the comparator circuit further comprises: a first hysteresis voltage source electrically connected between the negative input of the first comparator and the drain or source terminal of the power transistor; and a second hysteresis voltage source electrically connected between the positive input of the second comparator and the drain or source terminal of the power transistor.

Example 28. The current sense circuitry of any of examples 18 through 27, wherein the current mirror circuit comprises: a first transistor having a source terminal that corresponds to the input terminal of the current mirror circuit, a gate terminal, and a drain terminal electrically connected to the gate terminal; and a second transistor having a source terminal electrically connected to the source terminal of the first transistor, a gate terminal electrically connected to the gate terminal of the first transistor, and a drain terminal that corresponds to the output terminal of the current mirror circuit.

Example 29. The current sense circuitry of example 28, wherein the gate terminal of the second transistor is electrically connected to the gate terminal of the first transistor by a switch device in series with a resistor, and wherein the switch device is controlled by a gate signal applied to the power transistor such that the switch device is closed when the gate signal is active.

Example 30. A power electronics device, comprising: a GaN (gallium nitride) die comprising a first current sense terminal, a second current sense terminal, a main GaN power transistor, a GaN current sense transistor having a source electrically connected to a source of the main GaN power transistor, a diode device electrically connected in series between a drain of the main GaN power transistor and a drain of the GaN current sense transistor, a first voltage protection device electrically connecting the drain of the main GaN power transistor to the first sense terminal, and a second voltage protection device electrically connecting the drain of the GaN current sense transistor to the second sense terminal; and current sense circuitry comprising a current mirror circuit having an input terminal to sense a current at the second current sense terminal of the GaN die and an output terminal to provide a scaled-down version of the sensed current, a capacitor directly connected to the current mirror circuit at a first node, a comparator circuit having a first input electrically connected to the input terminal of the current mirror circuit, a second input electrically connected to the first current sense terminal of the GaN die, and an output that is in a first state when a voltage at the first input is higher than a voltage at the second input and in a second state when the voltage at the first input is lower than the voltage at the second input, a first switched current source configured to source current to the first node if the main GaN power transistor is on and the comparator output is in the second state, and a second switched current source configured to sink current from the first node if the main GaN power transistor is on and the comparator output is in the first state.

Example 31. The power electronics device of example 30, wherein a scaled version of the current at the output terminal of the current mirror circuit is fed forward to the first switched current source such that the current sourced to the first node by the first switched current source changes proportionally with the sensed current.

Example 32. The power electronics device of example 30, wherein a scaled version of the current at the output terminal of the current mirror circuit is fed forward to the second switched current source such that the current sunk from the first node by the second switched current source changes proportionally with the sensed current.

Example 33. The power electronics device of any of examples 330 through 32, wherein the main GaN power transistor is a low-side power transistor.

Example 34. The power electronics device of any of examples 330 through 33, wherein the comparator circuit comprises: a first comparator having a positive input electrically connected to the input terminal of the current mirror circuit, a negative input electrically connected to the first current sense terminal of the GaN die, and an output that drives a set input of a latch; and a second comparator having a positive input electrically connected to the first current sense terminal of the GaN die, a negative input electrically connected to the input terminal of the current mirror circuit, and an output that drives a reset input of the latch.

Example 35. The power electronics device of example 34, wherein the comparator circuit further comprises: a first hysteresis voltage source electrically connected between the negative input of the first comparator and the first current sense terminal of the GaN die; and a second hysteresis voltage source electrically connected between the positive input of the second comparator and the first current sense terminal of the GaN die.

Example 36. The power electronics device of any of examples 330 through 35, wherein the current mirror circuit comprises: a first transistor having a source terminal that corresponds to the input terminal of the current mirror circuit, a gate terminal, and a drain terminal electrically connected to the gate terminal; and a second transistor having a source terminal electrically connected to the source terminal of the first transistor, a gate terminal electrically connected to the gate terminal of the first transistor, and a drain terminal that corresponds to the output terminal of the current mirror circuit.

Example 37. The power electronics device of example 36, wherein the gate terminal of the second transistor is electrically connected to the gate terminal of the first transistor by a switch device in series with a resistor, and wherein the switch device is controlled by a gate signal applied to the main GaN power transistor such that the switch device is closed when the gate signal is active.

Terms such as "first", "second", and the like, are used to describe various elements, regions, sections, etc. and are also not intended to be limiting. Like terms refer to like elements throughout the description.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. Current sense circuitry, comprising:
a current mirror circuit configured to input a sensed current of a power transistor at an input terminal and provide a scaled-down version of the sensed current at an output terminal;
a capacitor directly connected to the current mirror circuit at a first node;
a comparator circuit having a first input electrically connected to the input terminal of the current mirror circuit, a second input electrically connected to a drain or source terminal of the power transistor, and an output that is in a first state when a voltage at the first input is higher than a voltage at the second input and in a second state when the voltage at the first input is lower than the voltage at the second input;
a first switched current source configured to source current to the first node if the power transistor is on and the comparator output is in the second state; and
a second switched current source configured to sink current from the first node if the power transistor is on and the comparator output is in the first state.

2. The current sense circuitry of claim 1, wherein the second input of the comparator circuit is electrically connected to the source terminal of the power transistor, wherein the first switched current source comprises a positive voltage source or charge pump, and wherein the second switched current source comprises a negative voltage source or charge pump.

3. The current sense circuitry of claim 1, wherein the second input of the comparator circuit is electrically connected to the drain terminal of the power transistor, and wherein both the first switched current source and the second switched current source each comprise a positive voltage source or charge pump.

4. The current sense circuitry of claim 1, wherein a scaled version of the current at the output terminal of the current mirror circuit is fed forward to the first switched current source such that the current sourced to the first node by the first switched current source changes proportionally with the sensed current.

5. The current sense circuitry of claim 1, wherein a scaled version of the current at the output terminal of the current mirror circuit is fed forward to the second switched current source such that the current sunk from the first node by the second switched current source changes proportionally with the sensed current.

6. The current sense circuitry of claim 1, wherein the power transistor is a low-side power transistor such that the current input to the input terminal of the current mirror circuit is from the low-side power transistor.

7. The current sense circuitry of claim 1, wherein the first switched current source is controlled by the output of the comparator circuit and a gate signal applied to the power transistor such that the first switched current source sources current to the first node if the gate signal is active and the comparator output is in the second state, and wherein the second switched current source is controlled by the output of the comparator circuit and the gate signal such that the second switched current source sinks current from the first node if the gate signal is active and the comparator output is in the first state.

8. The current sense circuitry of claim 1, wherein the comparator circuit comprises a single comparator having a positive input as the first input and a negative input as the second input.

9. The current sense circuitry of claim 1, wherein the comparator circuit comprises:
a first comparator having a positive input electrically connected to the input terminal of the current mirror circuit, a negative input electrically connected to the drain or source terminal of the power transistor, and an output that drives a set input of a latch; and
a second comparator having a positive input electrically connected to the drain or source terminal of the power transistor, a negative input electrically connected to the input terminal of the current mirror circuit, and an output that drives a reset input of the latch.

10. The current sense circuitry of claim 9, wherein the comparator circuit further comprises:
a first hysteresis voltage source electrically connected between the negative input of the first comparator and the drain or source terminal of the power transistor; and
a second hysteresis voltage source electrically connected between the positive input of the second comparator and the drain or source terminal of the power transistor.

11. The current sense circuitry of claim 1, wherein the current mirror circuit comprises:
a first transistor having a source terminal that corresponds to the input terminal of the current mirror circuit, a gate terminal, and a drain terminal electrically connected to the gate terminal; and
a second transistor having a source terminal electrically connected to the source terminal of the first transistor, a gate terminal electrically connected to the gate terminal of the first transistor, and a drain terminal that corresponds to the output terminal of the current mirror circuit.

12. The current sense circuitry of claim 11, wherein the gate terminal of the second transistor is electrically connected to the gate terminal of the first transistor by a switch device in series with a resistor, and wherein the switch device is controlled by a gate signal applied to the power transistor such that the switch device is closed when the gate signal is active.

13. A power electronics device, comprising:
a GaN (gallium nitride) die comprising a first current sense terminal, a second current sense terminal, a main GaN power transistor, a GaN current sense transistor having a source electrically connected to a source of the main GaN power transistor, a diode device electrically connected in series between a drain of the main GaN power transistor and a drain of the GaN current sense transistor, a first voltage protection device electrically connecting the drain of the main GaN power transistor to the first sense terminal, and a second voltage protection device electrically connecting the drain of the GaN current sense transistor to the second sense terminal; and current sense circuitry comprising a current mirror circuit having an input terminal to sense a current at the second current sense terminal of the GaN die and an output terminal to provide a scaled-down version of the sensed current, a capacitor directly connected to the current mirror circuit at a first node, a comparator circuit having a first input electrically connected to the input terminal of the current mirror circuit, a second input electrically connected to the first current sense terminal of the GaN die, and an output that is in a first state when a voltage at the first input is higher than a voltage at the second input and in a second state when the voltage at the first input is lower than the voltage at the second input, a first switched current source configured to source current to the first node if the main GaN power transistor is on and the comparator output is in the second state, and a second switched current source configured to sink current from the first node if the main GaN power transistor is on and the comparator output is in the first state.

14. The power electronics device of claim 13, wherein a scaled version of the current at the output terminal of the current mirror circuit is fed forward to the first switched current source such that the current sourced to the first node by the first switched current source changes proportionally with the sensed current.

15. The power electronics device of claim 13, wherein a scaled version of the current at the output terminal of the current mirror circuit is fed forward to the second switched current source such that the current sunk from the first node by the second switched current source changes proportionally with the sensed current.

16. The power electronics device of claim 13, wherein the main GaN power transistor is a low-side power transistor.

17. The power electronics device of claim 13, wherein the comparator circuit comprises:
- a first comparator having a positive input electrically connected to the input terminal of the current mirror circuit, a negative input electrically connected to the first current sense terminal of the GaN die, and an output that drives a set input of a latch; and
- a second comparator having a positive input electrically connected to the first current sense terminal of the GaN die, a negative input electrically connected to the input terminal of the current mirror circuit, and an output that drives a reset input of the latch.

18. The power electronics device of claim 17, wherein the comparator circuit further comprises:
- a first hysteresis voltage source electrically connected between the negative input of the first comparator and the first current sense terminal of the GaN die; and
- a second hysteresis voltage source electrically connected between the positive input of the second comparator and the first current sense terminal of the GaN die.

19. The power electronics device of claim 13, wherein the current mirror circuit comprises:
- a first transistor having a source terminal that corresponds to the input terminal of the current mirror circuit, a gate terminal, and a drain terminal electrically connected to the gate terminal; and
- a second transistor having a source terminal electrically connected to the source terminal of the first transistor, a gate terminal electrically connected to the gate terminal of the first transistor, and a drain terminal that corresponds to the output terminal of the current mirror circuit.

20. The power electronics device of claim 19, wherein the gate terminal of the second transistor is electrically connected to the gate terminal of the first transistor by a switch device in series with a resistor, and wherein the switch device is controlled by a gate signal applied to the main GaN power transistor such that the switch device is closed when the gate signal is active.

* * * * *